(12) United States Patent
Ivanov et al.

(10) Patent No.: US 12,019,101 B2
(45) Date of Patent: Jun. 25, 2024

(54) CURRENT MEASUREMENT AND CONTROL SYSTEM

(71) Applicant: TEXAS INSTRUMENTS INCORPORATED, Dallas, TX (US)

(72) Inventors: Vadim Valerievich Ivanov, Tucson, AZ (US); Srinivas Pulijala, Tucson, AZ (US); Piyush Kaslikar, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 155 days.

(21) Appl. No.: 17/874,667

(22) Filed: Jul. 27, 2022

(65) Prior Publication Data

US 2024/0036076 A1   Feb. 1, 2024

(51) Int. Cl.
  *G01R 15/14* (2006.01)
  *G01R 19/252* (2006.01)
  *H02M 1/00* (2007.01)

(52) U.S. Cl.
  CPC ......... *G01R 15/146* (2013.01); *G01R 19/252* (2013.01); *H02M 1/0009* (2021.05)

(58) Field of Classification Search
  CPC .. G01R 15/146; G01R 19/252; H02M 1/0009
  USPC ......................................................... 324/126
  See application file for complete search history.

(56) References Cited

U.S. PATENT DOCUMENTS

| | | | | |
|---|---|---|---|---|
| 2010/0259237 A1* | 10/2010 | Wang | ................... | H03F 3/45183 330/293 |
| 2012/0119718 A1* | 5/2012 | Song | ......................... | G05F 1/10 323/282 |
| 2015/0214910 A1* | 7/2015 | Duan | ................... | H03F 3/45183 330/261 |

* cited by examiner

*Primary Examiner* — Raul J Rios Russo
(74) *Attorney, Agent, or Firm* — John R. Pessetto; Frank D. Cimino

(57) ABSTRACT

A current measurement and control circuit may comprise a shunt resistor coupled between supply and output nodes; a first resistor coupled to the supply node; a second resistor coupled to ground; and a transconductance amplifier having an input coupled to the first resistor to define a compensation node and another input coupled to the output node. The circuit may also include a first transistor having a first current terminal coupled to the compensation node and a second current terminal coupled to the second resistor to define a measurement node; and a second transistor having a first current terminal coupled to ground and a second current terminal coupled to the output node. The circuit may also include an ADC having an analog input coupled to the measurement node; an IDAC having an analog output coupled to the compensation node; and switches to set the circuit in a measurement or a compensation mode.

19 Claims, 5 Drawing Sheets

CURRENT MEASUREMENT AND CONTROL SYSTEM

FIELD OF DISCLOSURE

This disclosure relates generally to current measurement and control systems, and more particularly to such systems that measure a load current and then provide compensation to control the load current.

BACKGROUND

Current measurement and control are important functions in various circuits, including in a DC-DC buck converter circuit, in which the load current varies as its switches between modes of operation. At low frequencies (<20 kHz), large current fluctuations cause an audible noise to be emitted as a result of voltage modulation on the supply bypass capacitor. Minimizing or smoothing these current fluctuations, and hence the resulting noise, is desirable.

One approach to addressing this issue is to monitor the load current in a sensing phase and then apply current compensation in a drive phase. A common way to monitor the load current is to sense a voltage difference across a shunt resistor through which the load current flows. The two input terminals of a sensing amplifier are coupled to respective ends of the shunt resistor, and the output of the sensing amplifier generates an analog voltage signal indicative of the voltage difference across the shunt resistor. The analog voltage signal (voltage difference) is then input to an analog-to-digital converter (ADC).

In a DC-DC buck converter in which the maximum load current is in the hundreds of mA range, the resistance of the shunt resistor may be any suitable value to produce a voltage difference in the tens of mV range. The ADC may have X-bit precision with a least significant bit (LSB) in the hundreds of µV range. The output of the ADC in this sensing phase is a digital value indicative of the sensed voltage difference.

In the drive phase, the digital value, which is input to a digital-to-analog converter (DAC), is used to control the load current. In the drive phase, the analog outputs of the sensing amplifier and the DAC are input to a summation function, the output of which is input to an integrator. Downstream of the integrator is an operational amplifier. A power transistor and a sense resistor are in the path of the load current, with the drain of the transistor coupled to the shunt resistor. The output of the integrator is coupled to the inverting input of the operational amplifier, and the non-inverting input of the operational amplifier is coupled to a node between the source of the power transistor and the sense resistor. The output of the operational amplifier drives the power transistor to generate current.

Existing current measurement and control configurations, such as that described above, require significant overhead in terms of space (footprint) and power consumption. Decreasing such overhead is desirable. In this context, aspects of the present disclosure arise.

SUMMARY

In an example, a current measurement circuit is provided. An example of such circuit, which may be employed in a DC-DC buck converter, comprises a shunt resistor, two other (first and second) resistors, a transconductance amplifier, a transistor, a capacitor, and an analog-to-digital converter (ADC). The shunt resistor is coupled between a supply node and an output node. One end of the first resistor is coupled to the supply node and the other end is coupled to a first input of the transconductance amplifier, which input is also coupled to a current terminal (e.g., drain) of the transistor. A second input of the transconductance amplifier is coupled to the output node. The second resistor is coupled between another current terminal (e.g., source) of the transistor and ground. The control terminal (e.g., gate) of the transistor is coupled to the output of the transconductance amplifier and to one end of the capacitor, the other end of which is coupled to ground. A measurement node is defined by the coupling between the first resistor and the source of the transistor. An analog-to-digital converter (ADC) has an analog input coupled to the measurement node.

In an example, a current compensation circuit is provided. An example of such circuit, which may be employed in a DC-DC buck converter, comprises a shunt resistor, two other (first and second) resistors, a transconductance amplifier, a transistor, and a current digital-to-analog converter (IDAC). The shunt resistor is coupled between a supply node and an output node. One end of the first resistor is coupled to the supply node and the other end is coupled to a first input of the transconductance amplifier. A second input of the transconductance amplifier is coupled to the supply node. The second resistor is coupled to ground. A transistor has first and second current terminals and a control terminal, in which the first current terminal is coupled to ground, the second current terminal is coupled to the supply node, and the control terminal is coupled to the output of the transconductance amplifier. The IDAC has a digital input adapted to receive a digital code and an analog output coupled to a compensation node formed by the coupling of the first input of the transconductance amplifier and the first resistor.

In an example, a current control circuit is provided. An example of such a current control circuit, which may be employed in a DC-DC buck converter, comprises a shunt resistor, two other (first and second) resistors, a transconductance amplifier, first and second transistors, a capacitor, an ADC, an IDAC, and switches. The shunt resistor is coupled between a supply node and an output node. One end of the first resistor is coupled to the supply node and the other end is coupled to a first input of the transconductance amplifier and to a current terminal (e.g., drain) of the first transistor. A second input of the transconductance amplifier is coupled to the output node. The second resistor is coupled between another current terminal (e.g., source) of the first transistor and ground. The output of the transconductance amplifier is selectively couplable to either the control terminal (e.g., gate) of the first transistor or to the control terminal (e.g., gate) of the second transistor by two of the switches. One current terminal (e.g., source) of the second transistor is coupled to the output node, and the other current terminal (e.g., drain) of the second transistor is coupled to ground. The capacitor is coupled between the gate of the first transistor and ground. The ADC has an analog input coupled to a measurement node defined by the coupling of the source of the first transistor and the first resistor. The IDAC) has an analog output coupled to a compensation node defined by the coupling of the drain of the first transistor, the first input of the transconductance amplifier and the other end of the first resistor. The switches are used to set the current control circuit in a measurement mode or a compensation mode.

In an example, a current control circuit is provided, which circuit may be employed in a DC-DC buck converter. An example of such a current control circuit comprises a shunt resistor coupled between a first supply node and an output node; a first resistor having a first end coupled to the first supply node; a second resistor having a first end coupled to ground; a third resistor having a first end coupled to a second supply node; a transconductance amplifier having first and second inputs and an output, the first input coupled a second end of the first resistor and defining a compensation node, and the second input coupled to the output node; a first transistor (e.g., M0) having first and second current terminals and a control terminal, the first current terminal (e.g., drain) of the first transistor coupled to the compensation node, the second current terminal (e.g., source) of the first transistor coupled to a second end of the second resistor and defining a measurement node; a second transistor (e.g., M1) having first and second current terminals and a control terminal, the first current terminal (e.g., drain) of the second transistor coupled to the second end of the third resistor, the second current terminal (e.g., source) of the second transistor coupled to the output node; a third transistor (e.g., M2) having first and second current terminals and a control terminal, the first current terminal (e.g., drain) of the third transistor coupled to the output node, the second current terminal (e.g., source) of the third transistor coupled to the second supply node, and the control terminal of the third transistor coupled to the first current terminal of the second transistor; an ADC having an analog input coupled to the measurement node; an IDAC having an analog output coupled to the compensation node; and a plurality of switches to set the current control circuit in a measurement mode or a compensation mode.

These and other features will be better understood from the following detailed description with reference to the accompanying drawings.

BRIEF DESCRIPTION OF THE DRAWINGS

Features of the disclosure may be understood from the following figures taken in conjunction with the detailed description.

DETAILED DESCRIPTION

Figure 1:
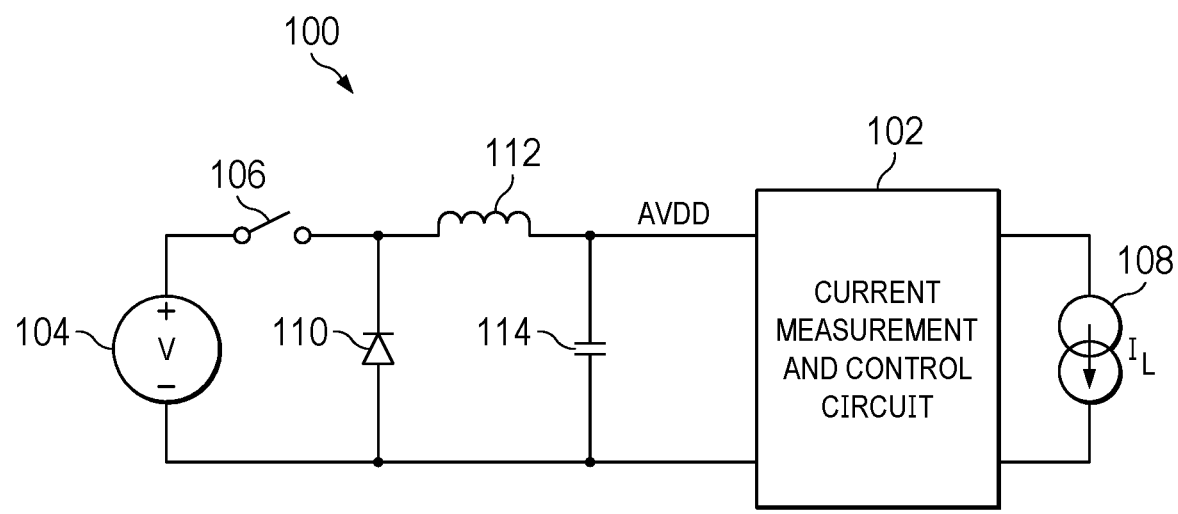
FIG. 1 is a circuit diagram of an example DC-DC buck converter coupled to a current measurement and control circuit.

Specific examples are described below in detail with reference to the accompanying figures. These examples are not intended to be limiting. In the drawings, corresponding numerals and symbols generally refer to corresponding parts unless otherwise indicated. The objects depicted in the drawings are not necessarily drawn to scale.

Current measurement and control circuits, as described herein, may be employed in various larger circuits in which a current (e.g., load current) is to be measured and controlled. One such larger circuit is a DC-DC buck converter, and example of which is shown in FIG. 1. Example DC-DC buck converter (or simply buck converter) 100 includes, or is associated with, a current measurement and control circuit 102. In general, as is known in the art, a buck converter is a type of DC-DC converter that converts an input voltage to a lower output voltage. The DC input can be derived from a rectified AC source or from a DC source. A buck converter operates by switching on and off at a set frequency, e.g., 250 Hz, to maintain a continuous output. Buck converters are widely used in various applications in which a stepped-down voltage is needed at the output.

FIG. 1 shows a relatively simplified topology of a buck converter merely as an example. Various other topologies exist. Example buck converter 100 includes an input voltage source 104, which in this example is a DC voltage source such as a battery. A switch 106, which may be implemented as a transistor or other suitable circuitry, is used to switch the buck converter between ON and OFF periods to supply a load current ($I_L$) to a load 108. Buck converter 100 also includes a diode 110, inductor 112 and capacitor 114 coupled as shown. Through the actions of switch 106, diode 110, inductor 112 and capacitor 114, the voltage across load 108 is generated and maintained.

To better control variation in load current $I_L$ as buck converter 100 switches between ON and OFF periods (or modes of operation), a current measurement and control circuit 102 is employed. An example configuration of current measurement and control circuit 102 is shown in FIG. 2.

Figure 2:
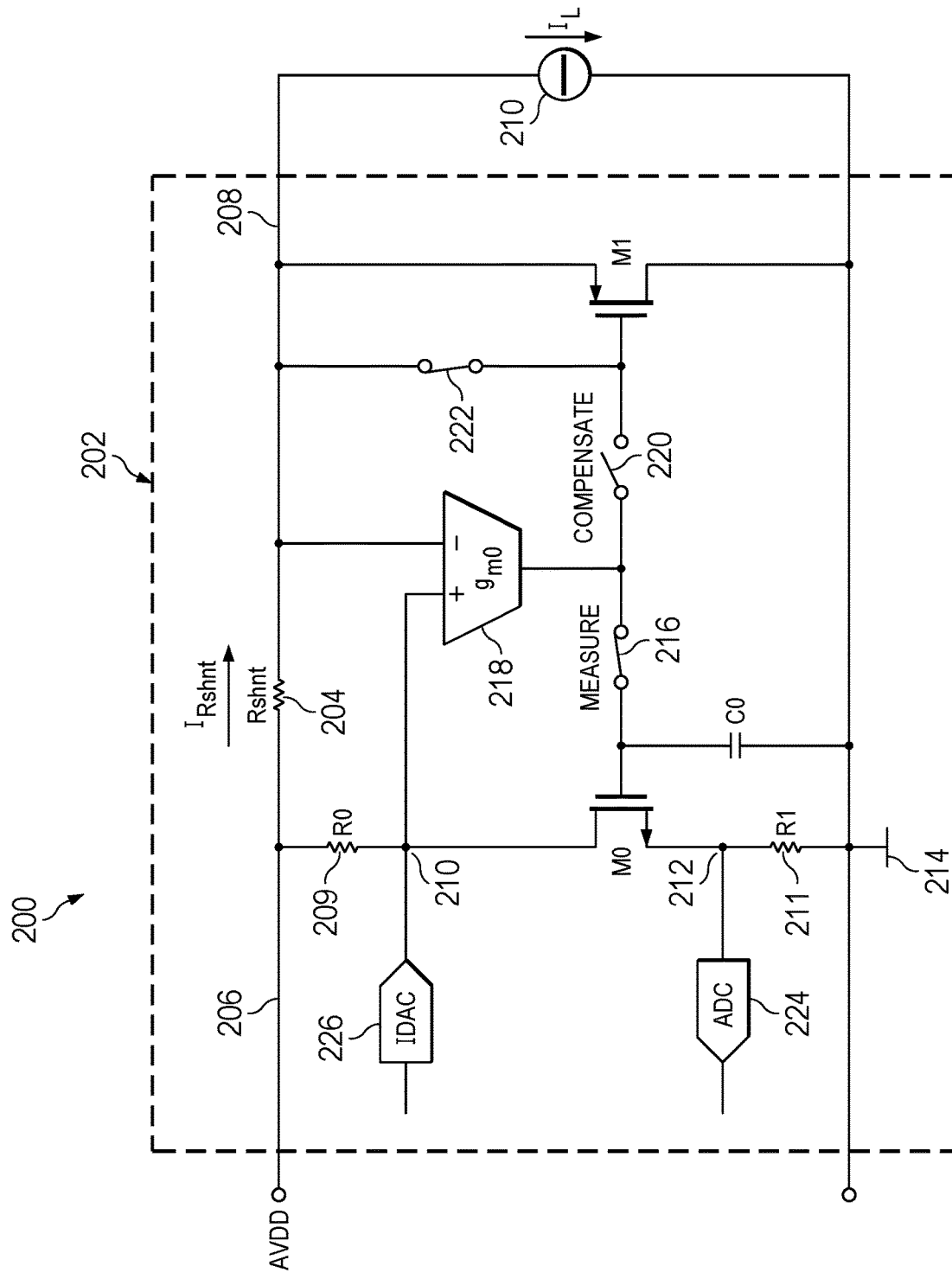
FIG. 2 is a circuit diagram of an example current measurement and control circuit.

Referring to FIG. 2, example current measurement and control circuit 202 includes a measurement function and a compensation function. Circuit 202 may be embodied in a system 200, which may be, or may include, a buck converter. Circuit 202 includes a shunt resistor 204 (having resistance Rshnt) coupled between a supply node 206 and an output node 208. Supply node 206 is adapted to be coupled to a voltage supply line (AVDD), and output node 208 is adapted to be coupled to a load 210 through which load current $I_L$ flows. A first resistor 209 (having resistance R0) has a first end coupled to supply node 206 and a second end coupled to a drain terminal of a first transistor M0. The node defined by the coupling of the second end of resistor 209 and the drain of M0 is a compensation node 210. One end of a second resistor 211 (having resistance R1) is coupled to a source terminal of transistor M0 to define a measurement node 212, and the other end of resistor 211 is coupled to ground 214. A capacitor C0 is coupled between the control terminal (e.g., gate) of transistor M0 and ground 214. The gate of transistor M0 is also coupled to a first terminal of measurement switch 216.

Current measurement and control circuit 202 also includes a transconductance amplifier 218, which has a first input coupled to the second end of resistor 209 and a second input coupled to output node 208. An output of transconductance amplifier 218 is coupled to a second terminal of measurement switch 216 and is also coupled to a first terminal of a compensation switch 220. The second terminal of compensation switch 220 is coupled to a control terminal (e.g., gate) of a second transistor M1, the source terminal of which is coupled to output node 208. The drain terminal of M1 is coupled to ground 214. Another switch 222 is operable to selectively couple output node 208 to the control terminal of transistor M1.

An analog-to-digital converter (ADC) 224 has an analog input coupled to measurement node 212. A current digital-to-analog converter (IDAC) 226 has an analog output coupled to compensation node 210. ADC 224 is active when circuit 202 is configured in a measurement mode during a measurement phase of operation, and IDAC 226 is active when circuit 202 is configured in a compensation mode during a compensation phase of operation.

To configure current measurement and control circuit 202 in measurement mode, each of measurement switch 216 and switch 222 is closed, and compensation switch 220 is opened. In this configuration circuit 202 operates in a measurement phase, in which transconductance amplifier 218, along with transistor M0 and resistors 209 and 211, operate as a current shunt monitor. The capacitance of capacitor C0 defines the bandwidth. The analog voltage at measurement node 212, denoted $V_{msr}$, is sampled by ADC 224 during the measurement phase. ADC 224 generates a digital code indicative of the $V_{msr}$. The digital code may represent an average of $V_{msr}$ during the measurement phase. With the resistances of shunt resistor 204, resistor 209, and resistor 211 denoted Rshnt, R0 and R1, respectively, during the measurement phase: $V_{msr} \cong I_L*Rshnt*R1/R0$.

Having a digital code representing $V_{msr}$, current measurement and control circuit 202 may be configured in compensation mode. To so configure circuit 202, measurement switch 216 and switch 222 are each opened and compensation switch 220 is closed. In the compensation phase, IDAC 226 receives the digital code generated by ADC 224 during the measurement phase and outputs a compensation current that is delivered to compensation node 210. In compensation mode, the current flowing to transistor M0 is sampled. Transconductance amplifier 218 and transistor M1 operate as a feedback loop so that the total current flowing through shunt resistor 204 (I Rshnt) is defined by the current flowing to transistor M0. During the compensation phase: $I_{Rshnt} \cong V_{msr}*R0/Rshnt*R1$.

Figure 3:
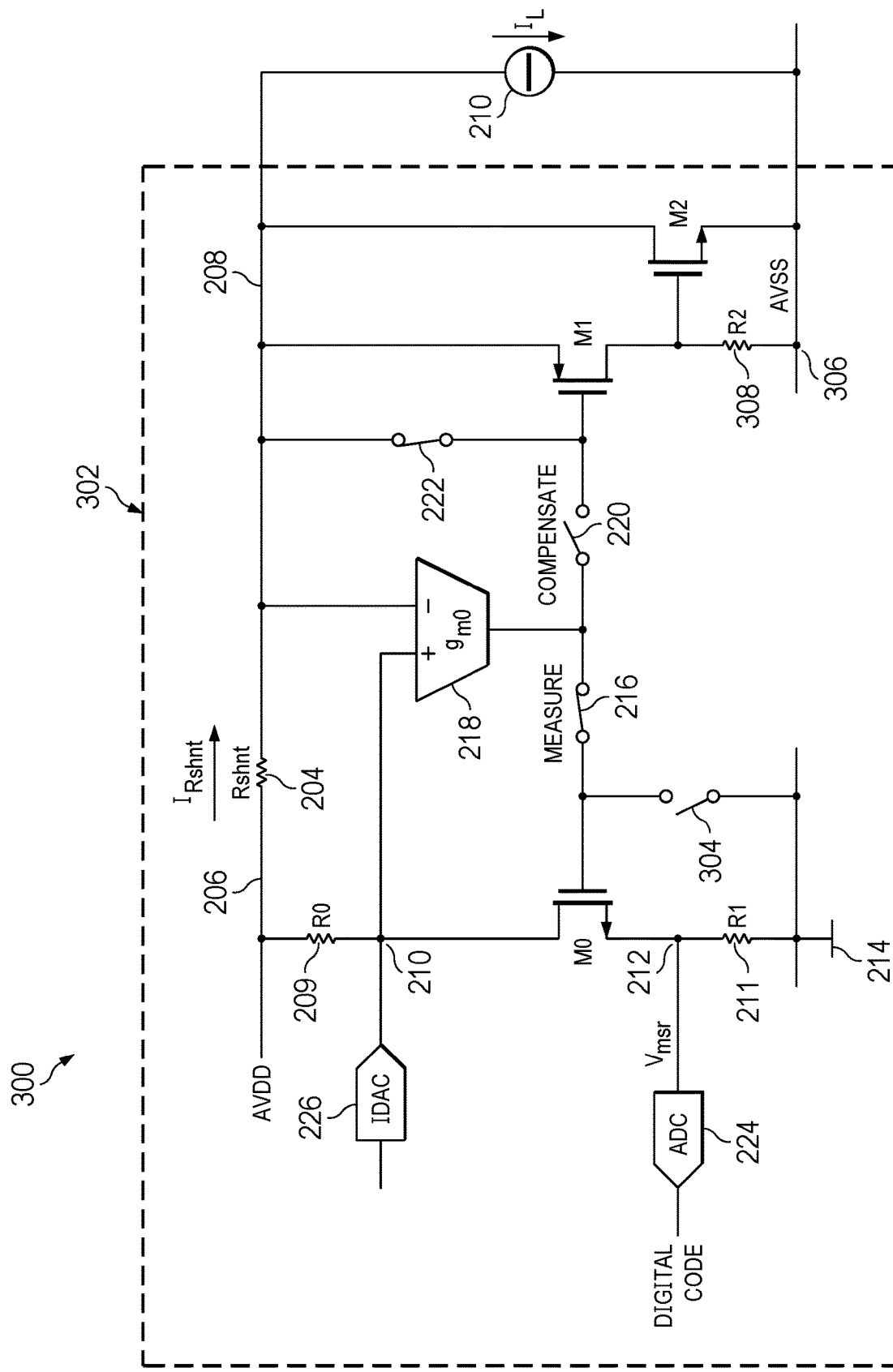
FIG. 3 is a circuit diagram of another example current measurement and control circuit set in the measurement mode.
Figure 4:
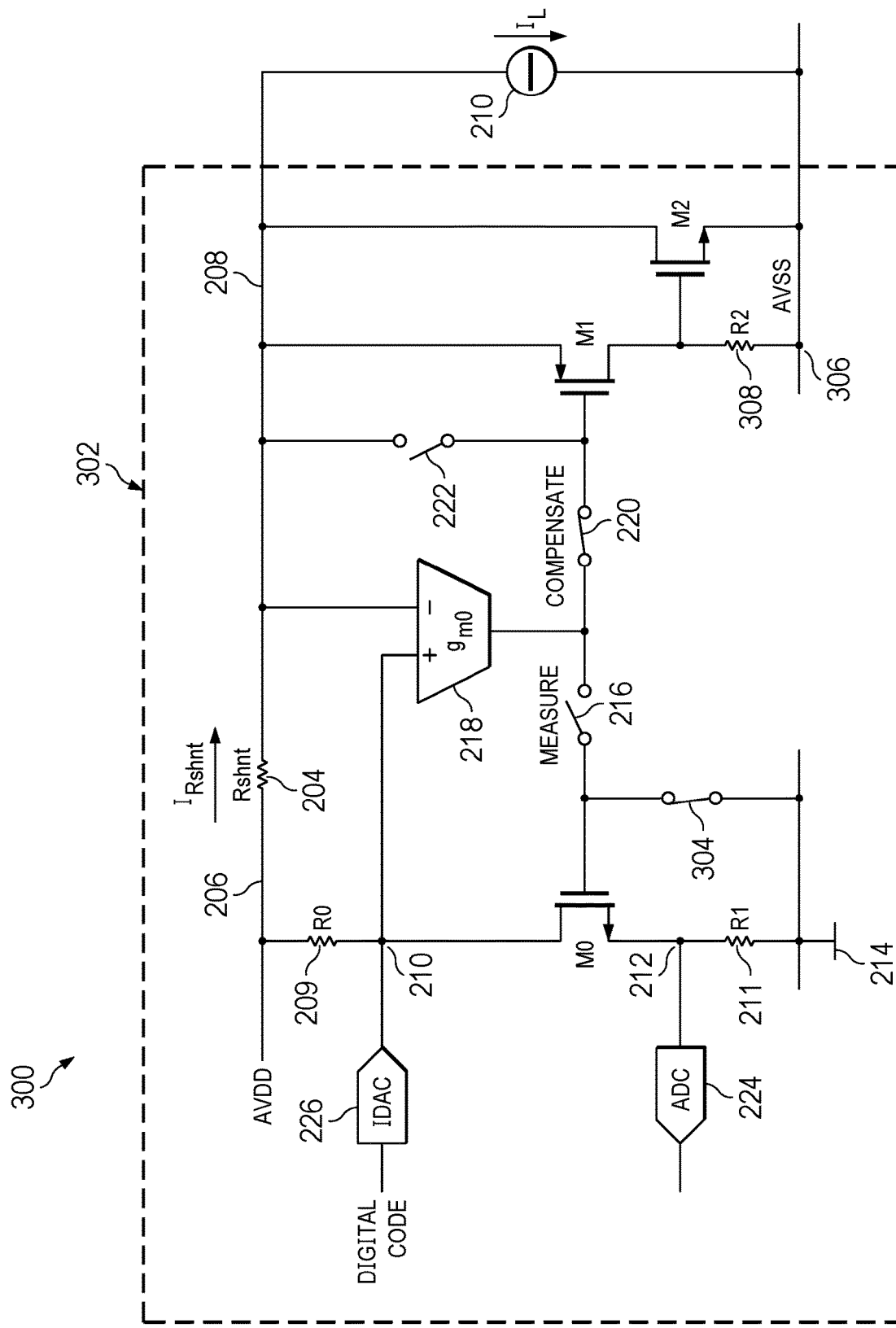
FIG. 4 is a circuit diagram of the example current measurement and control circuit of FIG. 3 but set in the compensation mode.

FIGS. 3 and 4 show another example current measurement and control circuit 302. Circuit 302 may be embodied in a system 300, which may be, or may include, a buck converter. In FIG. 3, circuit 302 is configured in measurement mode, and in FIG. 4, circuit 302 is configured in compensation mode. Each element in FIGS. 3 and 4 that is the same, or substantially the same, as a corresponding element in FIG. 2 is identified by the same reference numeral. Circuit 302 includes a switch 304 instead of capacitor C0. Circuit 302 also includes another transistor M2, the drain of which is coupled to output node 208 and a source of which is coupled to a second supply node 306 that is adapted to be coupled to a second voltage supply line (AVSS). An additional resistor 308 (having resistance R2) is coupled at one end to both the drain of transistor M1 and to the control terminal (e.g., gate) of transistor M2. The other end of resistor 308 is coupled to second supply node 306. The addition of gain-boosting transistor M2, along with resistor 308 coupled between the drain of M1 and second supply node 306, serves to increase the compensation current during the compensation phase. In an example, M2 is larger than either of M0 and M1 and thus may be configured off chip, with the other components being fabricated on a single chip.

During the measurement phase, circuit 302 is configured as shown in FIG. 3. That is, measurement switch 216 and switch 222 are closed, and compensation switch 220 and switch 302 are open. The measurement phase is carried out the same with circuit 302 as with circuit 202. The voltage is measured at measurement node 212 to generate analog voltage $V_{msr}$, which is converted into a digital code by ADC 224. During the measurement phase: $V_{msr} \cong I_L*Rshnt*R1/R0$.

During the compensation phase, circuit 302 is configured as shown in FIG. 4, with the switch positions reversed relative to their respective positions during measurement. IDAC 226 receives the digital code generated by ADC 224 during the measurement phase. That digital code is used to generate a compensation current that is delivered to compensation node 210. During the compensation phase, the feedback loop includes transconductance amplifier 218, transistors M1 and M2, as well as resistor 308. During the compensation phase: $I_{Rshnt} \cong V_{msr}*R0/Rshnt*R1$.

Figure 5:
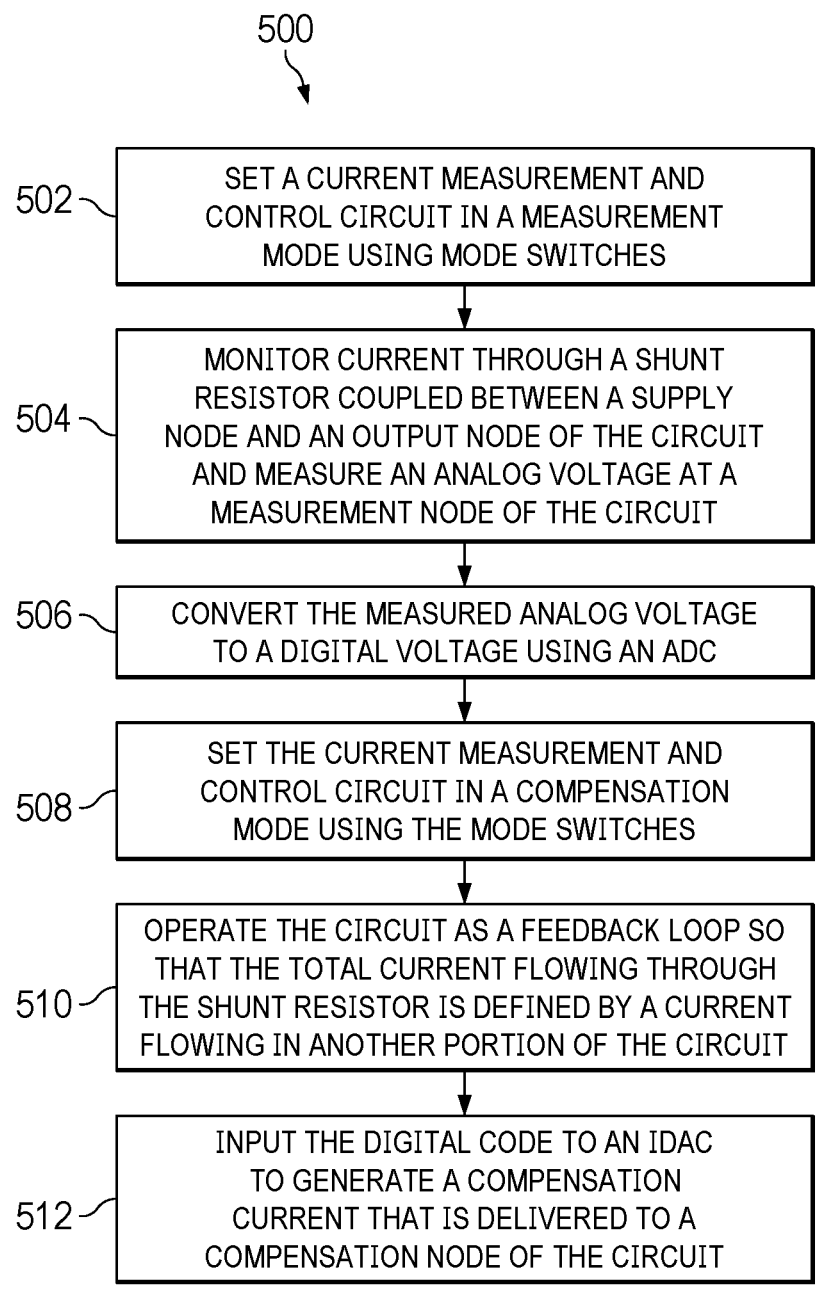
FIG. 5 is a flow diagram of an example method of operating an example current measurement and control circuit, such as that shown in any of FIGS. 2-4.

FIG. 5 is a flow diagram of an example method 500 of operating a current measurement and control circuit, e.g., circuit 202 and/or circuit 302. In operation 502, a current measurement and control circuit is set in a measurement mode using mode switches. That is, each of the mode switches in the circuit is set a measurement position, which may be open or closed depending on the switch. In operation 504, current through a shunt resistor coupled between a supply node and an output node is monitored, and an analog voltage at a measurement node of the circuit is measured. In operation 506, the measured analog voltage is converted to a digital code by an ADC. In operation 508, the positions of the mode switches are changed to set the current measurement and control circuit in a compensation mode. That is, in an example, each mode switch that was open during the measurement phase is now closed, and each mode switch that was closed during the measurement phase is now opened. With the circuit in compensation mode, in operation 510, the circuit is operated as a feedback loop so that the total current flowing through the shunt resistor is defined by a current flowing in another portion of the circuit. In operation 512, the digital code obtained during the measurement phase is input to an IDAC to generate a compensation current that is delivered to a compensation node of the circuit.

FIG. 5 depicts one possible order of operations in operating a current measurement and control circuit. Not all operations need necessarily be performed in the order described. Two or more operations may be performed substantially simultaneously and/or may be combined into a single operation. Alternative operations consistent with the teachings herein may be performed. Additional operations may be performed as well.

Various examples of current measurement and control circuits are provided. Any such circuit may be employed with a buck converter or other type of device in which current measurement and control is to be performed. When employed in a buck converter, any of the current measurement and control circuits described herein may be configured to minimize or smooth load current fluctuations as the buck converter switches between modes of operation. This, in turn, may greatly reduce voltage modulation on the supply bypass capacitor and hence result in quieter operation. Each of the current measurement and control circuits of FIGS. 2-4 is configured to consume less current and occupy a smaller footprint than conventional circuits. By occupying less die area and consuming less current, each of the current and measurement and control circuits is a further improvement over existing technology.

The term "coupled" and derivatives thereof, as used herein, include direct connection or coupling between two elements, indirect connection or coupling through one or more intervening elements. The term may cover connections, communications, or signal paths that enable a functional relationship consistent with this description. For example, if component A provides a signal to control component B to perform an action, in a first example component A is coupled to component B, or in a second example component A is coupled to component B through intervening component C if intervening component C does not substantially alter the functional relationship between components A and B.

A device or circuit that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device/circuit, through a construction and/or layout of hardware components and interconnections of the device/circuit, or a combination thereof.

As used herein, the term "terminal" may be a node, lead, interconnection and/or pin, which are considered interchangeable. Unless specifically stated to the contrary, these terms generally mean an interconnection between or a terminus of a device element, a circuit element, an integrated circuit, a device or other electronic or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead. For example, a p-type MOSFET may be used in place of an n-type MOSFET, and vice versa, with appropriate modifications to the circuit. Furthermore, other types of transistors may be used (such as bipolar junction transistors (BJTs)).

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a signal ground, a digital ground, a common ground, and/or any other form of ground connection applicable to, or suitable for, the teachings of this description. Unless otherwise stated, "about," "approximately," or "substantially" preceding a value means +/−10 percent of the stated value. Also, the identifiers such as a "first", "second", "third", etc. are simply used to distinguish among elements with the same or substantially the same name, and use of these identifiers in the claims may not correspond to their use in the specification.

Modifications of the described examples are possible, as are other examples, within the scope of the claims. Moreover, features described herein may be applied in other environments and applications consist with the teachings provided.

What is claimed is:

1. A current measurement circuit, comprising:
   a shunt resistor coupled between a supply node and an output node;
   a first resistor having a first end coupled to the supply node;
   a second resistor having a first end coupled to ground;
   a transconductance amplifier having first and second inputs and an output, the first input coupled to a second end of the first resistor and the second input coupled to the output node;
   a transistor having first and second current terminals and a control terminal, the first current terminal coupled to the second end of the first resistor and to the first input of the transconductance amplifier, the second current terminal coupled to a second end of the second resistor and defining a measurement node, and the control terminal coupled to the output of the transconductance amplifier;
   a capacitor coupled between the control terminal of the transistor and ground; and
   an analog-to-digital converter (ADC) having an analog input coupled to the measurement node.

2. The current measurement circuit of claim 1, wherein, during operation, the ADC is configured to measure a voltage at the measurement node, the measured voltage being based on a current through a load coupled to the output node, a resistance of the shunt resistor, a resistance of the first resistor, and a resistance of the second resistor.

3. The current measurement circuit of claim 2, wherein the ADC is configured to convert the voltage measured at the measurement node to a digital code.

4. The current measurement circuit of claim 1, wherein the capacitance of the capacitor defines the bandwidth of the current measurement circuit.

5. A current compensation circuit, comprising:
   a shunt resistor coupled between a supply node and an output node;
   a first resistor having a first end coupled to the supply node;
   a second resistor having a first end coupled to ground;
   a transconductance amplifier having first and second inputs and an output, the first input coupled to a second end of the first resistor and defining a compensation node, and the second input coupled to the output node;
   a transistor having first and second current terminals and a control terminal, the first current terminal coupled to ground, the second current terminal coupled to the supply node, and the control terminal coupled to the output of the transconductance amplifier; and
   a current digital-to-analog converter (IDAC) having a digital input and an analog output, the digital input adapted to receive a digital code and the analog output coupled to the compensation node.

6. The current compensation circuit of claim 5, wherein, during operation, the IDAC is configured to provide a compensation current to the compensation node to control a current through the shunt resistor based on the digital code.

7. The current compensation circuit of claim 5, wherein, during operation, a current through the shunt resistor is based on a voltage at the second current terminal of the transistor, a resistance of the shunt resistor, a resistance of the first resistor, and a resistance of the second resistor.

8. A current control circuit, comprising:
    a shunt resistor coupled between a supply node and an output node;
    a first resistor having a first end coupled to the supply node;
    a second resistor having a first end coupled to ground;
    a transconductance amplifier having first and second inputs and an output, the first input coupled to a second end of the first resistor and defining a compensation node, and the second input coupled to the output node;
    a first transistor having first and second current terminals and a control terminal, the first current terminal of the first transistor coupled to the compensation node, and the second current terminal of the first transistor coupled to a second end of the second resistor and defining a measurement node;
    a second transistor having first and second current terminals and a control terminal, the first current terminal of the second transistor coupled to ground, and the second current terminal of the second transistor coupled to the output node;
    a capacitor coupled between the control terminal of the first transistor and ground;
    an analog-to-digital converter (ADC) having an analog input coupled to the measurement node;
    a current digital-to-analog converter (IDAC) having an analog output coupled to the compensation node; and
    a plurality of switches to set the current control circuit in one of a measurement mode and a compensation mode.

9. The current control circuit of claim 8, wherein the plurality of switches includes a first switch, a second switch and a third switch.

10. The control circuit of claim 9, wherein the first switch is operable to couple the output of the transconductance amplifier to the control terminal of the first transistor, the second switch is operable to decouple the output of the transconductance amplifier from the control terminal of the second transistor, and the third switch is operable to couple the output node to the control terminal of the second transistor to set the control circuit in the measurement mode.

11. The current control circuit of claim 10, wherein, in measurement mode, the ADC is configured to measure a voltage at the measurement node and output a digital code indicative of the measured voltage.

12. The current control circuit of claim 9, wherein the first switch is operable to decouple the output of the transconductance amplifier from the control terminal of the first transistor, the second switch is operable to couple the output of the transconductance amplifier to the control terminal of the second transistor, and the third switch is operable to decouple the output node from the control terminal of the second transistor to set the control circuit in the compensation mode.

13. The current control circuit of claim 12, wherein, in the compensation mode, the IDAC is configured to provide a compensation current to the compensation node to control a current through the shunt resistor based on a digital code indicative of a voltage measured at the measurement node when the control circuit was in the measurement mode.

14. A current control circuit, comprising:
    a shunt resistor coupled between a first supply node and an output node;
    a first resistor having a first end coupled to the first supply node;
    a second resistor having a first end coupled to ground;
    a third resistor having a first end coupled to a second supply node;
    a transconductance amplifier having first and second inputs and an output, the first input coupled a second end of the first resistor and defining a compensation node, and the second input coupled to the output node;
    a first transistor having first and second current terminals and a control terminal, the first current terminal of the first transistor coupled to the compensation node, the second current terminal of the first transistor coupled to a second end of the second resistor and defining a measurement node;
    a second transistor having first and second current terminals and a control terminal, the first current terminal of the second transistor coupled to the second end of the third resistor, the second current terminal of the second transistor coupled to the output node;
    a third transistor having first and second current terminals and a control terminal, the first current terminal of the third transistor coupled to the output node, the second current terminal of the third transistor coupled to the second supply node, and the control terminal of the third transistor coupled to the first current terminal of the second transistor;
    an analog-to-digital converter (ADC) having an analog input coupled to the measurement node;
    a current digital-to-analog converter (IDAC) having an analog output coupled to the compensation node; and
    a plurality of switches to set the current control circuit in one of a measurement mode and a compensation mode.

15. The current control circuit of claim 14, wherein the plurality of switches includes a first switch, a second switch, a third switch, and a fourth switch.

16. The current control circuit of claim 14, wherein the first switch is operable to couple the output of the transconductance amplifier to the control terminal of the first transistor, the second switch is operable to decouple the output of the transconductance amplifier from the control terminal of the second transistor, the third switch is operable to couple the output node to the control terminal of the second transistor, and the fourth switch is operable to decouple the control terminal of the first transistor from ground to set the control circuit in the measurement mode.

17. The current control circuit of claim 14, wherein the first switch is operable to decouple the output of the transconductance amplifier from the control terminal of the first transistor, the second switch is operable to couple the output of the transconductance amplifier to the control terminal of the second transistor, the third switch is operable to decouple the output node from the control terminal of the second transistor, and the fourth switch is operable to couple the control terminal of the first transistor to ground to set the control circuit in the compensation mode.

18. The current control circuit of claim 16, wherein, in measurement mode:
    the ADC is configured to measure a voltage at the measurement node,
    the plurality of switches are set such that the voltage measured at the measurement node is based on a current through a load coupled to the output node, a resistance of the shunt resistor, a resistance of the first resistor, and a resistance of the second resistor, and
    the ADC is further configured to convert the voltage measured at the measurement node to a digital code for input to the IDAC in the compensation mode.

19. The current control circuit of claim 17, wherein, in the compensation mode:

the IDAC is configured to receive a digital code from the ADC, the digital code indicative of a voltage measured at the measurement node when the control circuit was in the measurement mode, the plurality of switches are set such that a current through the shunt resistor is based on the voltage at the measurement node determined in the measurement mode, a resistance of the shunt resistor, a resistance of the first resistor, and a resistance of the second resistor, and the IDAC is further configured to provide a compensation current to the compensation node based on the digital code received from the ADC.

\* \* \* \* \*